(12) United States Patent
Wang et al.

(10) Patent No.: US 7,067,026 B2
(45) Date of Patent: Jun. 27, 2006

(54) PROCESS FOR THE CONSTRAINED SINTERING OF A PSEUDO-SYMMETRICALLY CONFIGURED LOW TEMPERATURE COFIRED CERAMIC STRUCTURE

(75) Inventors: Carl B. Wang, Raleigh, NC (US); Kenneth Warren Hang, Hillsborough, NC (US); Christopher R. Needes, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/994,594

(22) Filed: Nov. 22, 2004

(65) Prior Publication Data

US 2006/0108049 A1    May 25, 2006

(51) Int. Cl.
*B32B 18/00*    (2006.01)
*B32B 37/16*    (2006.01)

(52) U.S. Cl. ............... 156/89.11; 156/89.12; 156/89.16; 428/210; 361/321.1

(58) Field of Classification Search .............. None
See application file for complete search history.

(56) References Cited

U.S. PATENT DOCUMENTS

| | | | |
|---|---|---|---|
| 4,536,535 A | 8/1985 | Usala | |
| 4,654,095 A | 3/1987 | Steinberg | |
| 5,085,720 A | 2/1992 | Mikeska et al. | |
| 5,102,720 A * | 4/1992 | Raj | 428/209 |
| 5,144,526 A | 9/1992 | Vu et al. | |
| 5,254,191 A | 10/1993 | Mikeska et al. | |
| 5,396,397 A * | 3/1995 | McClanahan et al. | 361/313 |
| 5,708,570 A * | 1/1998 | Polinski, Sr. | 361/762 |
| 5,866,240 A * | 2/1999 | Prabhu et al. | 428/210 |
| 6,139,666 A | 10/2000 | Fasano et al. | |
| 6,205,032 B1 * | 3/2001 | Shepherd | 361/793 |
| 6,776,861 B1 * | 8/2004 | Wang et al. | 156/89.11 |
| 6,827,800 B1 * | 12/2004 | Wang et al. | 156/89.11 |
| 2002/0189742 A1 * | 12/2002 | Moriya et al. | 156/89.11 |
| 2003/0113554 A1 * | 6/2003 | Umayahara et al. | 428/446 |
| 2004/0211506 A1 * | 10/2004 | Wang et al. | 156/89.11 |
| 2005/0008874 A1 * | 1/2005 | Wang et al. | 428/426 |

FOREIGN PATENT DOCUMENTS

WO    00/04577    *    1/2000

OTHER PUBLICATIONS

U.S. Appl. No. 10/336,439, filed Jan. 2, 2003, Wang et al.
U.S. Appl. No. 10/430,081, filed May 6, 2003, Wang et al.
U.S. Appl. No. 60/385,697, filed Jun. 4, 2002, Wang et al.

* cited by examiner

*Primary Examiner*—Melvin Mayes

(57) ABSTRACT

This invention relates to a process which produces flat, distortion-free, zero-shrink, low-temperature co-fired ceramic (LTCC) bodies, composites, modules or packages from precursor green (unfired) laminates of three or more different dielectric tape chemistries that are configured in an uniquely or pseudo-symmetrical arrangement in the z-axis of the laminate.

15 Claims, 5 Drawing Sheets a b

4a

4b

PROCESS FOR THE CONSTRAINED SINTERING OF A PSEUDO-SYMMETRICALLY CONFIGURED LOW TEMPERATURE COFIRED CERAMIC STRUCTURE

FIELD OF THE INVENTION

This invention relates to a flat, distortion-free, zero-shrink, low-temperature co-fired ceramic (LTCC) bodies, composites, modules or packages from precursor green (unfired) laminates of three or more different dielectric tape chemistries that are configured in an uniquely or pseudo-symmetrical arrangement in the z-axis of the laminate.

BACKGROUND OF THE INVENTION

An interconnect circuit board or package is the physical realization of electronic circuits or subsystems from a number of extremely small circuit elements electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several levels of conductors separated by corresponding insulating dielectric tape layers. The conductor layers are interconnected through the dielectric layers that separate them by electrically conductive pathways, called via fills.

In all subsequent discussion it is understood that the use of the term tape layer or dielectric layer implies the presence of metallizations both surface conductor and interconnecting via fills which are cofired with the ceramic tape. In a like manner the term laminate or composite implies a collection of metallized tape layers that have been pressed together to form a single entity.

The use of a ceramic-based green tape to make low temperature co-fired ceramic (LTCC) multilayer circuits was disclosed in U.S. Pat. No. 4,654,095 to Steinberg. The co-fired, free sintering process offered many advantages over previous technologies. However, when larger circuits were needed, the variation of firing shrinkage along the planar or x,y direction proved too broad to meet the needs. Given the reduced sizes of the current generation of surface mount components, the shrinkage tolerance (reproducibility of x,y shrinkage) has proved too great to permit the useful manufacture of LTCC laminates much larger than 6" by 6". This upper limit continues to be challenged today by the need for greater circuit density as each generation of new circuits and packages evolves. In turn this translates into ever-smaller component sizes and thereby into smaller geometry's including narrower conductor lines and spaces and smaller vias on finer pitches in the tape. All of this requires a much lower shrinkage tolerance than could be provided practically by the free sintering of LTCC laminates.

A method for reducing x,y shrinkage during firing of green ceramic bodies in which a release layer, which becomes porous during firing, is placed upon the ceramic body and the assemblage is fired while maintaining pressure on the assemblage normal to the body surface was disclosed in U.S. Pat. No. 5,085,720 to Mikeska. This method used to make LTCC multilayer circuits provided a significant advantage over Steinberg, as a reduction x,y shrinkage was obtained through the pressure assisted method.

An improved co-fired LTCC process was developed and is disclosed in U.S. Pat. No. 5,254,191 to Mikeska. This process, referred to as PLAS, an acronym for pressure-less assisted sintering, placed a ceramic-based release tape layer on the two major external surfaces of a green LTCC laminate. The release tape controls shrinkage during the firing process. Since it allows the fired dimension of circuit features to be more predictable the process represents a great improvement in the fired shrinkage tolerance.

A slight modification of the art proposed by Mikeska is presented in U.S. Pat. No. 6,139,666 by Fasano et al. where the edges of a multilayer ceramic are chamfered with a specific angle to correct edge distortion, due to imperfect shrinkage control exerted by externally applied release tape during firing.

Shepherd proposed another process for control of registration in an LTCC structure in U.S. Pat. No. 6,205,032. The process fires a core portion of a LTCC circuit incurring normal shrinkage and shrinkage variation of an unconstrained circuit. Subsequent layers are made to match the features of the pre-fired core, which then is used to constrain the sintering of the green layers laminated to the rigid pre-fired core. The planar shrinkage is controlled to the extent of 0.8–1.2% but is never reduced to zero. For this reason, the technique is limited to a few layers, before registration becomes unacceptable.

During the release tape-based constrained sintering process, the release tape acts to pin and restrain any possible shrinkage in x- and y-directions. The release tape itself does not sinter to any appreciable degree and is removed prior to any subsequent circuit manufacturing operation. Removal is achieved by one of a number of suitable procedures such as brushing, sand blasting or bead blasting. The use of the sacrificial constraining tape or release tape means that the user must purchase a tape material that does not reside in the final product. Furthermore, the top and bottom conductors cannot be co-processed with the laminate. These necessary steps may only be carried as part of a post-fired strategy after firing and removal of the release tape.

In a more recent invention, U.S. patent application 60/385,697 the teachings of constrained sintering are extended to include the use of a non-fugitive, non-removable, non-sacrificial or non-release, internal self-constraining tape. The fired laminate comprises layers of a primary dielectric tape which define the bulk properties of the final ceramic body and one or more layers of a secondary or self-constraining tape. The purpose of the latter is to constrain the sintering of the primary tape so that the net shrinkage in the x, y direction is zero. This process is referred to as a self-constraining pressure-less assisted sintering process and the acronym SCPLAS is applied. The self-constraining tape is placed in strategic locations within the structure and remains part of the structure after co-firing is completed. There is no restriction on the placement of the self-constraining tape other than that z-axis symmetry is preserved.

FIG. 1, which contains some generic dielectric tape arrangements, is used to illustrate the definition of z-axis symmetry as noted in U.S. Patent Application 60/385,697. In this embodiment, only one type of self-constraining (SC) tape (101) is used with a primary tape (100). The criterion is that the distribution of the two tape materials (100, 101) is balanced in terms of thickness and position around the centerline (103) of the structure. The consequence of not preserving z-axis symmetry is a severely bowed or cambered circuit.

The invention described in U.S. patent application 60/385,697 represents an alternative to release tape-based constrained sintering. However, it is not obvious as to how one can apply this to the practical manufacture of ceramic structures with asymmetric arrangements of metallized tape layers comprising two different dielectric chemistries.

The introduction of dielectric layers with a higher dielectric constant (k) than the bulk dielectric material can produce localized enhanced capacitor capability when suitably terminated with a conductor material. This is commonly referred to as a buried passive structure and is a robust and cost-effective alternative to the use of standard, externally applied, surface mount components such as multilayer capacitors (MLC). In U.S. Pat. No. 5,144,526 awarded to Vu and Shih, LTCC structures are described whereby high dielectric constant materials are interleaved with layers of low dielectric constant material in a symmetrical arrangement.

In practical terms the need for symmetry limits the freedom of a designer to layout a circuit in its most optimal form. This, in turn, has some unfavorable consequences relative to the performance, the form factor and the overall cost of the circuit. An ability to obviate this problem represents a significant competitive advantage to the continued growth of ceramic circuit packages. The only solution currently available, namely, to balance the asymmetrical and functional part of the structure with dummy, non functioning compensating layers (see FIG. 2) does not alleviate all of the disadvantages described above.

FIG. 3 shows some examples of some simple asymmetric arrangements. Actual designs would be more complex. Nonetheless, regardless of the complexity factor, the most intractable problem associated with such arrangements is that the structure will bow or camber to an unacceptable degree after co-firing. Moreover it will be cambered to a degree that will render it unusable for subsequent processing such as assembly by pick and place of passive and active surface components. The conventional definition of unacceptable camber or bowing is greater than an 0.003 inch deflection of the center point of a substrate per one inch of substrate diagonal length, e.g. a total of 0.025 inches for a 6"×6" co-fired substrate. Different operations have different requirements but the above definition meets the majority of applications. The extent of this disadvantage increases with substrate size. It can pass almost unnoticed for substrates less than 2"×2" but becomes very marked as the standard substrate dimension is increased to 6"×6".

The above problem is caused by differences in the physical and chemical properties of the two dielectric materials in contact with each other and exists with all known combinations of dielectric chemistries. It will occur regardless of the absence or presence of metallic conductors in the structure. It thus represents a significant limitation to the ongoing development of the technology as a whole.

In a more recent application, U.S. patent application Ser. No. 10/430,081, the teachings of constrained sintering is extended to the production of large area camber-free, co-fired LTCC structures that are derived from asymmetric arrangements of low dielectric constant primary tape and high k dielectric constant self-constraining tape materials, each of a different chemistry. It combines the use of both of internal, permanent, self-constraining tape and external, removable release constraining tape.

As already discussed the asymmetric structures as illustrated in FIG. 3 cannot be co-fired flat by conventional processing techniques. They will tend to bow or camber in a concave manner i.e. the two edges of the laminate will be significantly higher than the center-point in the direction perpendicular to the plane of maximum asymmetry.

In an embodiment of U.S. patent application Ser. No. 10/430,081, now U.S. Pat. No. 6,827,800 as shown in FIG. 4, an internal constraining layer (101) is formulated to provide a self-constraining function and an embedded capacitor function within a LTCC assembly. The properties of the processed internal constraining layer provide a rigid physical form restraining x and y shrinkage of primary tapes (100) and impart functional properties to the final LTCC assembly. The internal constraining tape precedes the sintering of the primary tape layers. To prevent bowing and permanent structural distortion after co-firing because of the difference in dielectric chemistries without the need to symmetrically balance it with dummy or compensating layers, a layer of removable, non permanent release layer (201) is applied to the outside surface directly opposite the source of greatest asymmetry. This enables extremely asymmetric structures to be fired flat. After firing, the release layer is removed using conventional brushing or sand blasting methods.

However, the necessary inclusion of a release layer (201) and its removal after firing still adds cost in material, equipment, and process. Meanwhile, the bottom conductor in contact with the release layer cannot be co-processed with the laminate. This necessary step may only be carried as part of a post-fired strategy after firing and removal of the release tape.

The current invention represents an innovative approach to produce a structure exhibiting an interactive suppression of x,y shrinkage without the use of a sacrificial dielectric release tape at one side of the laminate as specified in U.S. patent application Ser. No. 10/430,081 now U.S. Pat. No. 6,827,800.

BRIEF SUMMARY

The present invention is a distortion-free and camber-free, asymmetrical, low-temperature co-fired ceramic structure consisting essentially of one or more layers of low k glass-containing internal self-constraining tape, one or more layers of high k glass-containing internal self-constraining tape, and at least one layer of glass-containing primary tape wherein the dielectric constant of the low k tape is less than 8, the dielectric constant of the high k tape is greater than 8 and wherein each self-constraining tape can independently provide a self-constraining pressure-less assisted sintering LTCC assembly with the primary tape and wherein the self-constraining tapes are arranged to preserve structural symmetry regarding the class of self-constraining tapes as an entity with respect to the primary tape wherein the internal constraining tapes and the primary tape are laminated to form a compositionally asymmetrical laminate and wherein the assembly is thermally processed producing a structure exhibiting an interactive suppression of x,y shrinkage.

DETAILED DESCRIPTION OF THE INVENTION

Figure 1:
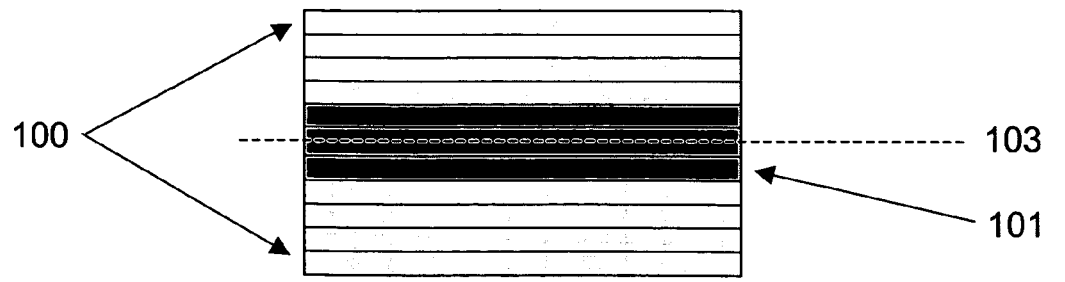
FIGS. 1a–1b are an illustration of generic dielectric tape arrangements used to illustrate the definition of z-axis symmetry, these are related to U.S. patent application 60/385,697 now U.S. Pat. No. 6,776,861.
Figure 1:
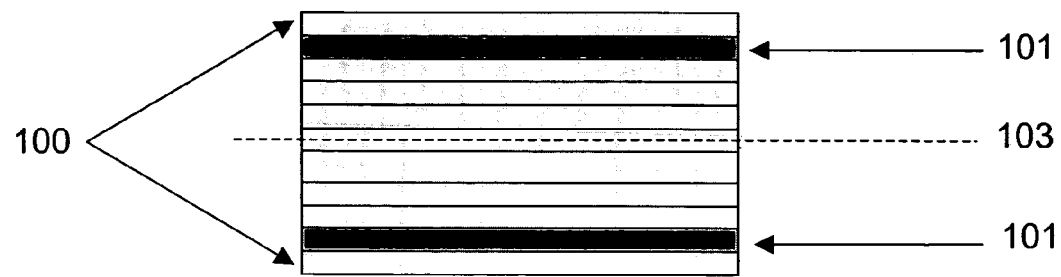
Figure 1:
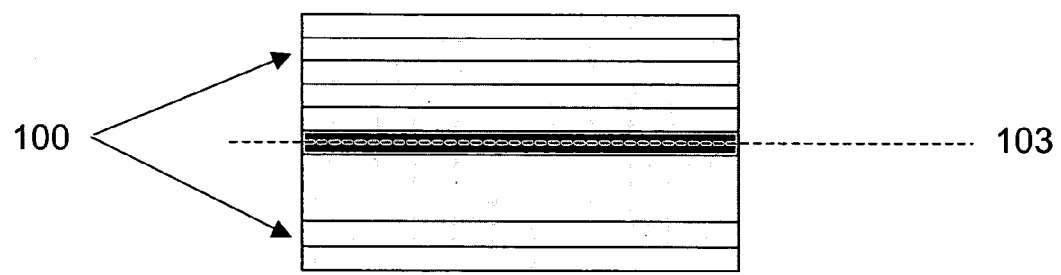
Figure 1:
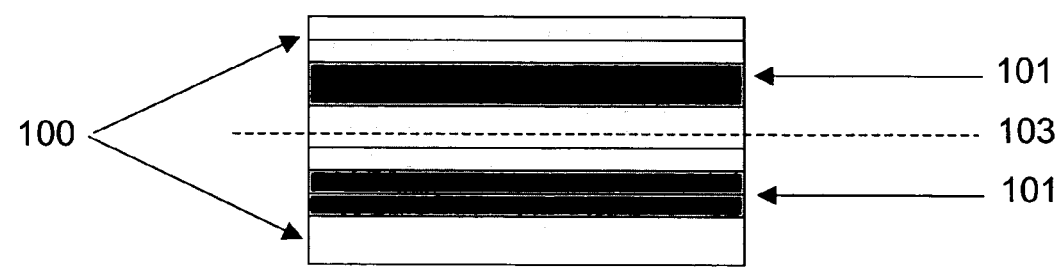
Figure 2:
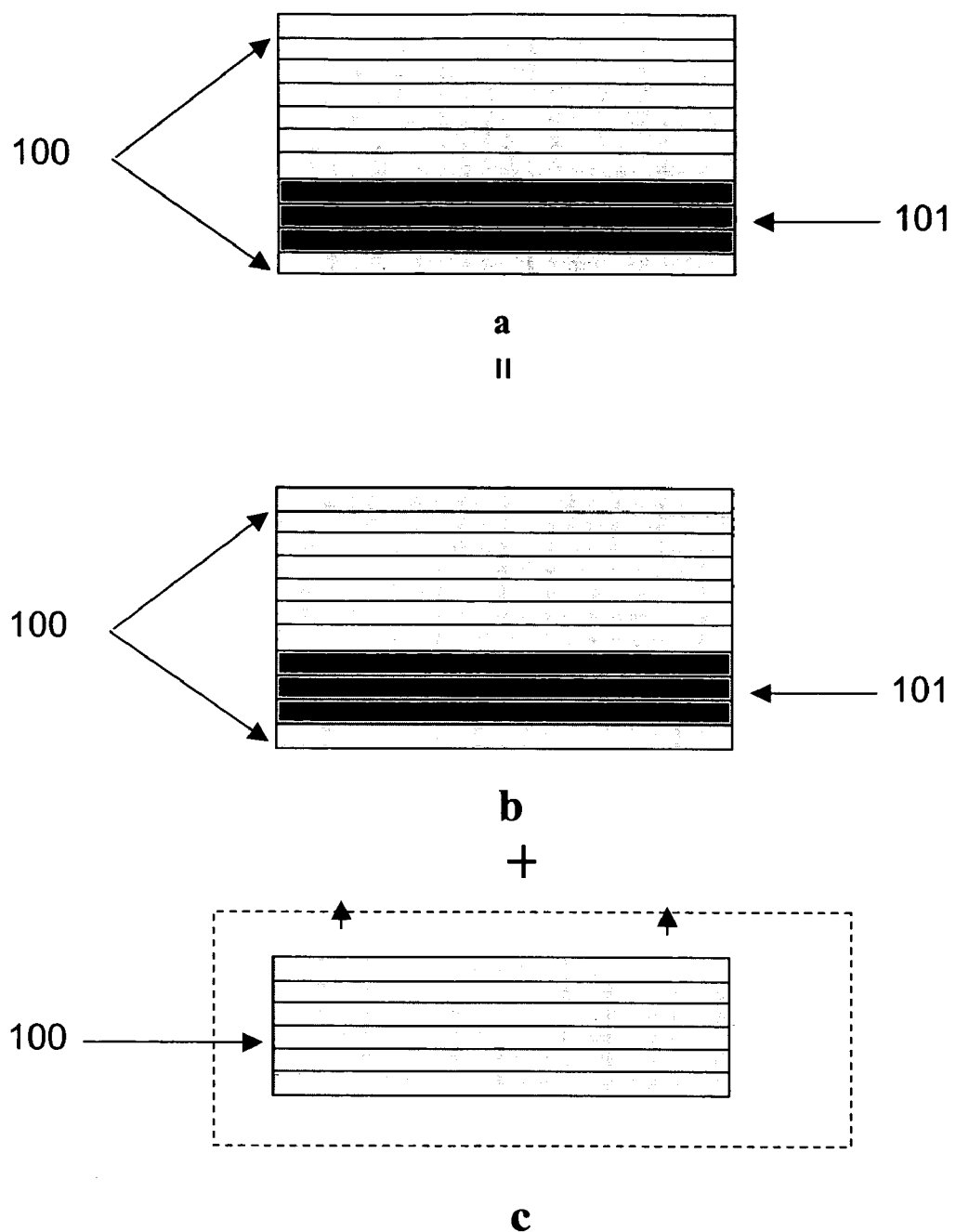
FIGS. 2a–2c are an illustration of the addition of prior art non-functional material necessary to render the LTCC structure symmetrical and co-fireable without any bowing or cambering. The equal sign means that the function of the severely cambered assemblage 2A can only be provided by a camber-free assemblage after adding 2C to the 2B laminate before firing.
Figure 3:
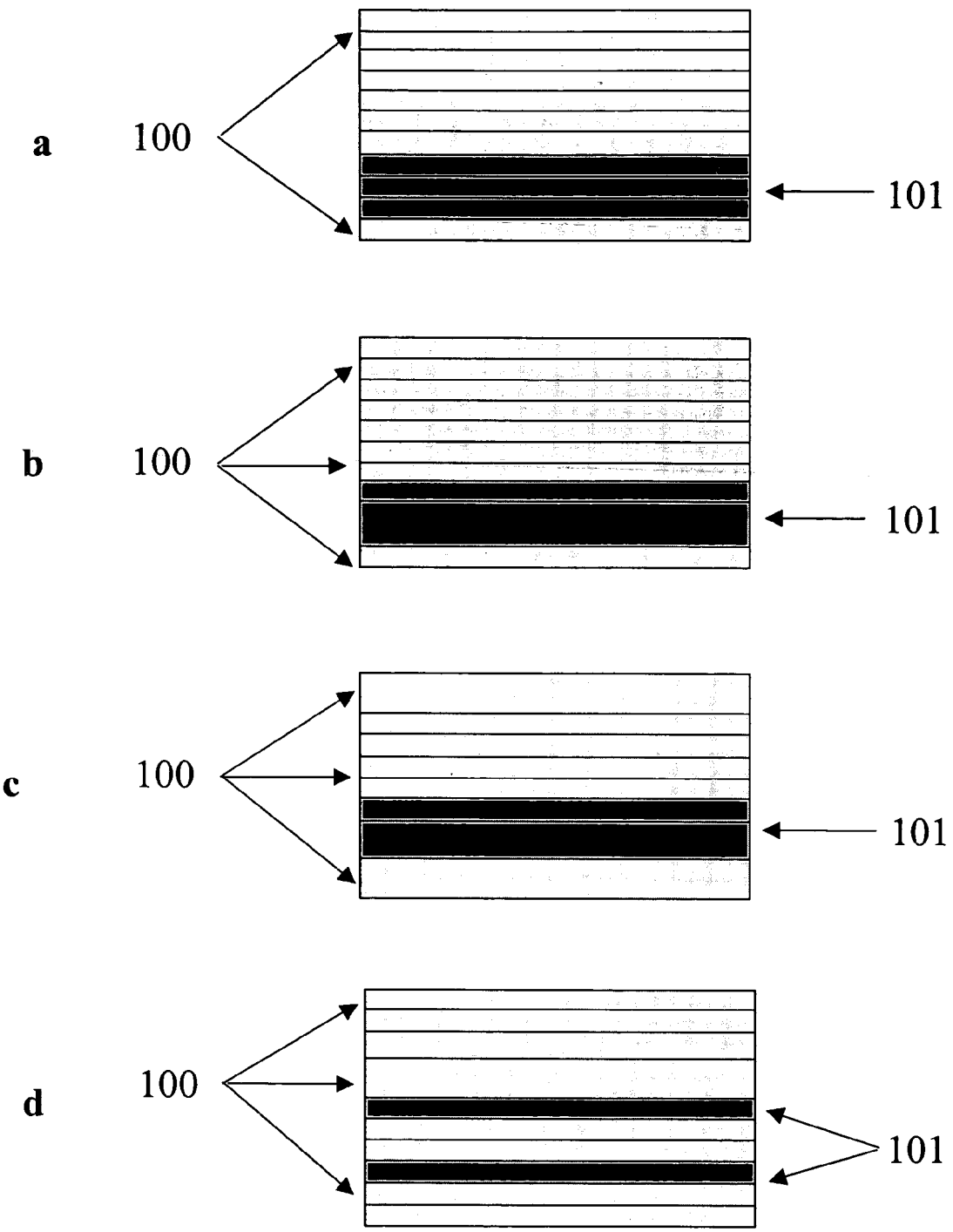
FIGS. 3a–3d are an illustration of prior art asymmetrical structures where tapes of two different chemistries are present and all will display severe camber after co-firing.
Figure 4:
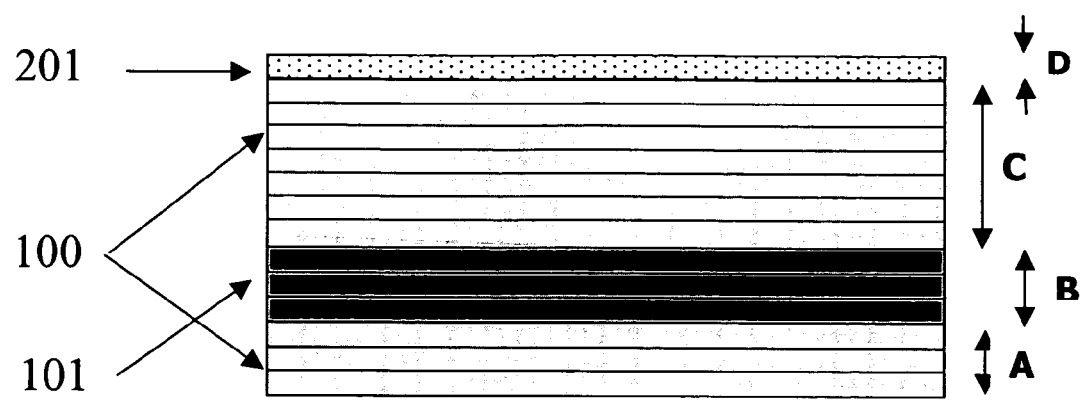
FIGS. 4a–4b are an illustration of asymmetrical structures of the previous invention, U.S. patent application Ser. No. 10/430,081 now U.S. Pat. No. 6,827,800.
Figure 4:
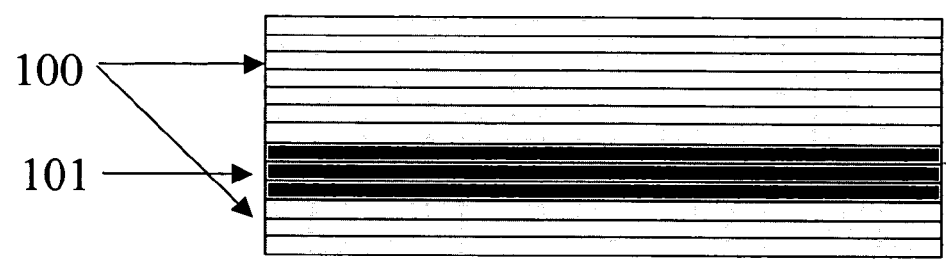

The current invention further extends the concept of making asymmetrical configured LTCC dielectric multilayer circuits to include at least two internal constraining tapes having the same or different k values, without the use of sacrificial release tape at one side of the multilayer laminate. In order to preserve the balance in sintering stress to produce a flat or camber-free substrate, it is necessary that (a) each internal constraining tape (501 or 502) can independently provide a zero-shrink SCPLAS system with the primary tape (100), and (b) the internal constraining tapes are arranged to preserve structural symmetry regarding the class of internal constraining tapes as an entity with respect to primary tape. Since the internal constraining tapes are generally of different composition and dielectric constant (k), the term of "pseudo-symmetry" is created. The above pseudo-symmetrical arrangement treats all of the self-constraining tapes as a class with respect to the primary tape, and the name "pseudo" reflects the differences among the self-constraining tapes involved.

While the structure of the LTCC multilayer circuit of the present invention may be asymmetrical around the centerline, there is still a requirement that the internal constraining tapes be arranged to preserve structural symmetry regarding the class of internal constraining tapes as an entity with respect to the primary tape. This means that when viewing the structure as two pieces, a top and bottom around the centerline, the level of shrinkage associated with each piece independently should be the same (or about the same) to ensure a uniform shrinkage with regard to the structure as a whole. Of course, the preferred level of shrinkage for the structure as a whole is zero-shrinkage, although any uniform level may be achieved for the structure as a whole, as long as each independent piece about the centerline may achieve the same shrinkage level independently.

There are several possible embodiments of the present invention subject to the above requirements for preservation of the balance in sintering stress as noted above. These embodiments include: (1) all internal constraining tapes and the primary tape have the same dielectric constant (k); (2) at least one internal constraining tape has the same dielectric constant (k) as the primary tape; and (3) at least one internal constraining tape is a low k tape and at least one internal constraining tape is a high k tape. This invention also applies to a primary tape of either low k or high k characteristic. In the case with a low k primary tape, the internal constraining tapes may have the same or higher k. In the case of a high k primary tape, the internal constraining tapes may have the same or lower k.

The differences in the dielectric tape chemistry result from differences in the types and compositions of the glass(es) or the filler(s) used to formulate the tapes and reflect in their corresponding dielectric constant (k) at any given frequency. For the purpose of clarification of this invention, a standard k is between 7 and 9. The typical primary tape is generally at a k value between 7 and 9, although this k value is not a necessary requirement of the primary tape. For purposes of this invention, a tape with a k value at or lower than 8 is considered a low k tape, whereas a tape with a k value greater than 8 is considered a high k tape. It is therefore apparent that the high k values can be multiples of tens, hundreds, or thousands as far as this invention is concerned. Furthermore, tapes having k values within 0–15% of one another are considered to have the same k.

In the case when one of the internal constraining tapes has the same k as the primary tape, a compositionally and electrically asymmetrical configuration is attained. It is noted that, due to the structural symmetry between internal constraining tapes and primary tape, the multilayer circuit can be fired flat and provide zero-shrink without the use of a sacrificial release tape as described in the prior art noted above.

Figure 5:
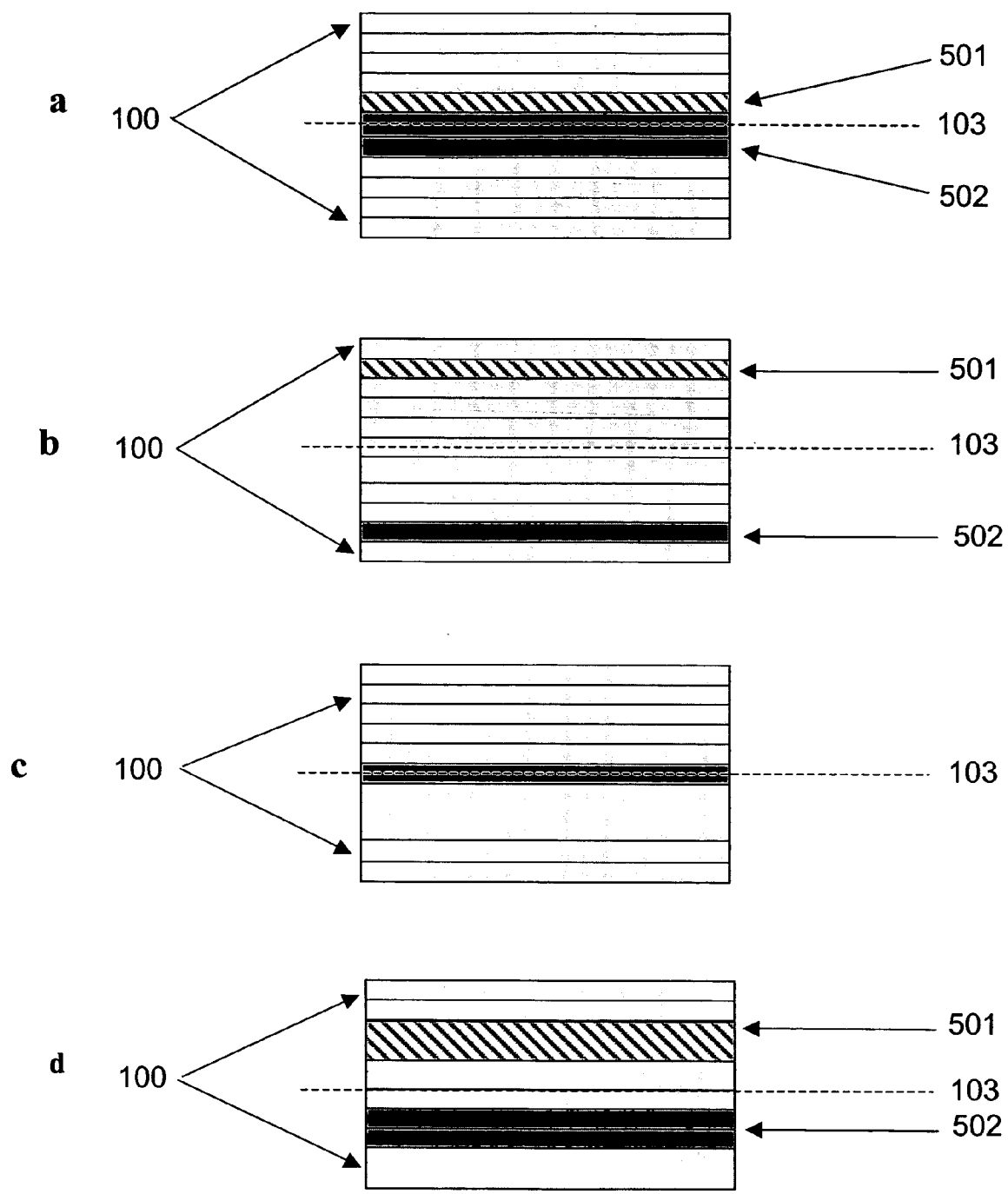
FIGS. 5a–5d are an illustration of pseudo-symmetrically configured mixed k dielectric layers according to the present invention within a third and primary low k, low temperature cofired ceramic matrix of the current invention. Tapes 501 and 502 represent internal constraining tapes of the same or different k value whereas tape 100 represents the primary tape component and 103 is the centerline of the structure.

FIGS. 5a–5d illustrate various multilayer arrangements of internal constraining tapes and primary tape according to this invention. It is noted that the present invention can be applied but not limited to these examples. Internal constraining tapes 501 and 502 form the central core in 5a. Internal constraining tape 501 or 502 serves as the constraining layer in the upper or lower portion of structure in 5b. Either internal constraining tape 501 or 502 by itself can form the core as in 5c, which is the simplest configuration of this invention and represents a typical SCPLAS concept previously filed for patent. FIG. 5d illustrates an expanded version of 5b to include flexibility in tape thickness and layer count variation.

Internal Self-Constraining Tape(s)

The internal constraining tape (501, 502) as utilized in the present invention contains glasses that flow, densify, and become rigid at temperatures significantly below 850° C., which is a standard process temperature. Because the constraining tape becomes part of the final LTCC body it significantly increases the performance requirements for the constraining tape material. The electrical properties (e.g., dielectric constant k) of the constraining tape may also be adjusted with a choice of materials that make up the tape. This makes possible the use of more than one chemical type of primary tape to locally control the dielectric and other electrical properties of a portion of a LTCC circuit.

Primary Tape

The primary tape (100) is generally the majority tape in a LTCC assembly and the resultant fired assembly derives its mechanical and electrical characteristics from it. In most situations the constraining tape has a minority presence in the structure. It can be used effectively to locally modify aspects of the dielectric and other electrical performance of the assembly, but its biggest influence is to control the physical structure by constraining its x,y shrinkage substantially to zero.

LTCC Structure

During the heating of the assembly of the present invention, the glass in the constraining tapes (low or high k, respectively for 501 or 502) attains its transition temperature (the temperature at which the glass initiates sintering, followed by flow and densification) earlier than the glass of the primary tape (low k) and it flows sufficiently to coat the surface particles of the adjacent layers of the primary tape. Since the crystallization temperature of the constraining tape glass is both close to and above its transition temperature, crystallization occurs very soon thereafter. This has the result of stiffening the glass and significantly raising its composite viscosity or elevating its re-melting temperature beyond the peak firing temperature of 825 to 875° C. of the first co-firing and/or subsequent post-firing process.

The constraining influence of the primary tape ensures that x,y shrinkage in the constraining tape is very small, if not zero. Subsequent increases in temperature cause the constraining tape to sinter fully and its glass to complete its crystallization. Since a suitable glass will, typically, develop in excess of 50 volume % crystalline phases, the constraining tape body becomes rigid when dominated by the volumetric accumulation of crystalline content of filler and in site formation of crystal from the glass. Then, when the transition temperature of the primary tape glass is achieved and flow occurs, it is kept physically in place by its previous interaction with the constraining tapes. Thus, the already-sintered constraining tape layers become the constraining force and the primary tape is constrained while sintering to shrink only in the z-direction. Once the assembly is fully sintered and has cooled down, the assembly will be seen to possess the same dimensions in the x,y direction as the original "green" or unfired assembly. The layers of the now chemically-reacted inorganic components of the two or more individual tapes used in the assembly are interleaved in various configurations. The only still observable boundaries being those where tapes of different chemistries were placed adjacent to each other and where the various inner circuit features reside. The above discussion is applicable to configurations presented in FIGS. 5b and 5d.

In the special case of 5a, the two different internal constraining tapes, 501 and 502, are in direct contact. This type of structure requires sufficient interfacial bonding between the internal constraining tapes without significant inter-diffusion of glass from either or both tapes during the firing process. As in all of the cases, the primary tape (100) serves as the constraining force for both internal constraining tapes (501, 502) in the lower temperature range; and the sintered and crystalline, rigid SC layers serve as the constraining force for the primary tape in the higher temperature range.

Such an innovation offers the advantages of facilitating cofireable top and bottom conductors, relieves the practical restrictions that externally-constrained sintered structures experience as the layer count is increased and the constraining influence of the external release tape is felt less and less. Furthermore, there is no need to remove the sacrificial constraining tape by mechanical and/or chemical means. This represents a saving of material and equipment expenditure and labor, and also possible environmental contamination. In addition, the use of the constraining tape allows the formation of exactly dimensioned, non-shrink cavities in a tape structure. Both blind and through cavities can be produced by this constrained sintering technique.

In order to meet the performance requirements of LTCC circuit manufacturers, additional material performance factors must be considered beyond the simple process of constraining the x,y shrinkage in the green tape assembly when thermally processed. The coefficient of thermal expansion of the constraining tapes and the primary tape must be sufficiently close in magnitude to provide for the production of 6"×6" or larger ceramic boards consisting of many layers of laminated green tape materials. Inattention to this could result in stress induced cracking in the fired ceramic LTCC body during the temperature descending portion of the furnace firing or thereafter.

Another design factor is created because the constraining tapes must be thermally processed to a rigid body prior to the primary tape to provide proper system x,y constraint. This means that the glass-filler material in the constraining tapes should be designed to attain a lower composite viscosity to the primary tape, but at approximately 50–150° C. lower in temperature and preferably in the range of 80–150° C. It should be noted that the above assessment was based on a belt furnace firing profile at an ascending rate of 6–8° C. per minute between 450° C. and –850° C. Such a profile is commonly used to achieve high throughput in mass production of LTCC circuit substrates. However, a smaller temperature difference (e.g. <50° C.) can also be effective if the firing profile in a multiple zone belt or box furnace provides a plateau to facilitate the full densification, and/or crystallization, and revivification of the constraining tapes. It should also provide sufficient compatibility between constraining and primary tapes during the densification to maintain the strength and bonding at the respective tape interfaces. This compatibility can be influenced by tape formulation, physical characteristics of the constituents and changes in thermal processing conditions. The electrical properties of the constraining tape materials must also meet performance requirements for high frequency circuit applications.

Components of Internal Constraining and Primary Tapes

Internal constraining and primary tape components and formulations are discussed below. The internal constraining tapes (501, 502) are further characterized as composed of a filler ceramic material such as $Al_2O_3$, $TiO_2$, $ZrO_2$, $ZrSiO_4$, $BaTiO_3$, etc., with a crystallizable or filler reactable glass composition so that its flow, densification and rigidification during firing proceed the remaining layers of primary tape. Although a constraining or primary tape normally may consist of a glass and filler, it may be designed by skilled artisans to utilize more than one glass or more than one filler. The physical act of restricting the x,y shrinkage of the constraining tapes by the primary tape during thermal processing is quite similar to the externally applied release layers of a conventional primary tape assembly. It is to be noted, however, that although the terms of "primary tape" and "constraining tape" are used in this invention, the "primary tape" constrains the "constraining tape" during its lower temperature sintering/crystallization process; whereas the already sintered "constraining tape" constrains the "primary tape" during its higher temperature firing. The requirements for suitable materials to serve as a non-sacrificed constraining tape are however different. The material requirements are considered below.

Specific examples of glasses that may be used in the primary or constraining tape are listed in Table 1. Preferred glass compositions found in the high k constraining tape comprise the following oxide constituents in the compositional range of: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %. The more preferred composition of glass being: $B_2O_3$ 11.84, BaO 21.12, $Li_2O$ 1.31, $P_2O_5$ 4.14, $TiO_2$ 25.44, $Cs_2O$ 6.16, $Nd_2O_3$ 29.99 in weight %. Another preferred glass comprises the following oxide constituents in the compositional range of: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight %. The preferred composition of glass being: $SiO_2$ 13.77, $ZrO_2$ 4.70, $B_2O_3$ 26.10, BaO 14.05, MgO 35.09, $Li_2O$ 1.95, $P_2O_5$ 4.34 in weight %.

Additions have been made to the Table 1 glass composition tables previously disclosed in prior applications. A composition 18 has been added as similar to the primary tape glass shown in composition 17. Additional high k glass compositions have been found to perform as suitable constraining tapes when incorporated into a standard tape formulation. These additional compositions are designated ID #19 and #20. These compositions are similar to the previously noted preferred compositions with the exception that $Cs_2O$ has been replaced by $K_2O$ with no loss or change of functional property.

Example glasses for use in the low k constraining tapes comprise the following oxide constituents in the compositional range of: Glass #2 Table 1 is an example of a glass that has a suitably low dielectric constant while serving suitably as a constraining glass in an LTCC tape structure. The dielectric constant of a tape composed of this glass (3.06 g/cc) and 33.9 volume % alumina filler having a D50 PSD of 2.5 micron is about 8.

Glasses 21 and 22 in the above table are examples of constraining tape glasses that are not suitable to achieve essentially zero x,y shrinkage when paired with a primary glass such as tape made from glass 15, 17 or 18. The TMA characteristics are somewhat higher to onset sintering than suitable constraining glasses such as glass #2, #6, #19 or #20. This prevents the complete attainment of zero X, Y shrinkage.

In order to match the dielectric constant (k) in one of the constraining tape to that of the primary tape, the design of glass varies significantly from that in the high k constraining tape. It is well known that the choice of inorganic filler(s) in the constraining tape compositions also affect their resultant k; hence the tape compositions represent an overall property balance in order to provide zero-shrink, material compatibility, and desirable electrical performance such as k and loss tangent for high frequency applications. Several suitable fillers that maybe used to adjust lower the composite dielectric constant of a suitable LTCC tape composition include cordierite, forsterite, steatite, amorphous silica, aluminum phosphate (AlPO4), (CGW) Vycor glass or other crystalline or amorphous lower k ceramic materials.

TABLE 1

(wt. %)

| Glass # | $SiO_2$ | $Al_2O_3$ | PbO | $ZrO_2$ | $B_2O_3$ | CaO | ZnO | BaO | MgO | $La_2O_3$ | $Na_2O$ | $Li_2O$ | SrO | $P_2O_5$ | $TiO_2$ | $K_2O$ | $Cs_2O$ | $Nd_2O_3$ |
|---|---|---|---|---|---|---|---|---|---|---|---|---|---|---|---|---|---|---|
| 1 | | | | | 6.08 | | | 23.12 | | | | | | 4.50 | 34.25 | | | 32.05 |
| 2 | 13.77 | | | 4.70 | 26.10 | | | 14.05 | 35.09 | | | 1.95 | | 4.34 | | | | |
| 3 | 52.00 | 14.00 | | | 9.00 | 17.50 | 3.00 | | 4.50 | | | | | | | | | |
| 4 | | | | | 11.91 | | | 21.24 | | | | 0.97 | | 4.16 | 26.95 | | 4.59 | 30.16 |
| 5 | 56.50 | 9.10 | 17.20 | | 4.50 | 8.00 | | | 0.60 | | 2.40 | | | | 1.70 | | | |
| 6 | | | | | 11.84 | | | 21.12 | | | | 1.31 | | 4.14 | 25.44 | | 6.16 | 29.99 |
| 7 | 52.00 | 14.00 | | | 8.50 | 17.50 | | | 4.75 | | 2.00 | 0.25 | | | 1.00 | | | |
| 8 | | | | | 6.27 | | | 22.79 | | | | 0.93 | | 4.64 | 33.76 | | | 31.60 |
| 9 | | | | | 9.55 | | | 21.73 | | | | 0.92 | | 4.23 | 32.20 | | 1.24 | 30.13 |
| 10 | | | | | 10.19 | | | 21.19 | | | | 0.97 | | 4.15 | 28.83 | | 4.58 | 30.08 |
| 11 | 13.67 | | | 5.03 | 25.92 | | | 13.95 | 34.85 | | | 1.94 | | 4.64 | | | | |
| 12 | 12.83 | | | 4.65 | 21.72 | | | 13.09 | 34.09 | | | 1.96 | | 11.65 | | | | |
| 13 | 13.80 | | | 4.99 | 25.86 | | | 13.45 | 33.60 | | | 2.09 | | 4.35 | | | 1.87 | |
| 14 | 52.00 | 14.00 | | | 9.00 | 17.50 | | | 5.00 | | 1.75 | 0.25 | | | 0.50 | | | |
| 15 | 53.50 | 13.00 | | | 8.50 | 17.00 | | | 1.00 | | 2.25 | 0.25 | 3.00 | | 1.50 | | | |
| 16 | 13.76 | | | 4.70 | 22.60 | | | 14.05 | 35.10 | | | 1.95 | | 7.84 | | | | |
| 17 | 54.00 | 12.86 | | | 8.41 | 16.82 | | | 0.99 | | 2.23 | 0.25 | 2.97 | | | 1.48 | | |
| 18 | 54.50 | 12.72 | | | 8.32 | 16.63 | | | 0.98 | | 2.20 | 0.24 | 2.94 | | | 1.47 | | |
| 19 | | | | | 12.35 | | | 22.02 | | | | 1.36 | | 4.32 | 26.53 | 2.15 | | 31.27 |
| 20 | | | | | 12.22 | | | 21.79 | | | | 0.85 | | 4.27 | 26.24 | 3.70 | | 30.93 |
| 21 | 8.74 | | | 2.44 | 11.77 | | | 7.30 | 2.48 | 27.55 | | 1.15 | | 4.00 | | | 6.10 | 28.45 |
| 22 | 9.36 | | | 2.62 | 12.19 | | | 7.82 | 5.09 | 19.67 | | 1.34 | | 4.28 | | | 7.15 | 30.47 |
| 23 | 7.63 | | | | 12.63 | | | 22.26 | 5.36 | 15.76 | | 1.26 | | 2.58 | | 1.99 | | 30.52 |
| 24 | | | | | 12.26 | | 9.55 | 21.59 | 4.14 | 15.29 | | 1.31 | | 4.16 | | 2.07 | | 29.62 |
| 25 | 5.66 | | | | 12.71 | | | 21.68 | 4.04 | 19.19 | | 1.41 | | 4.18 | | 1.39 | | 29.73 |

Preferred glasses for use in the primary tape comprise the following oxide constituents in the compositional range of: $SiO_2$ 52–54, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %. The more preferred composition of glass being: $SiO_2$ 53.50, $Al_2O_3$ 13.00, $B_2O_3$ 8.50, CaO 17.0, MgO 1.00 $Na_2O$ 2.25, $Li_2O$ 0.25, SrO 3.00, $K_2O$ 1.50 in weight %.

In the primary or constraining tape the $D_{50}$ (median particle size) of frit is preferably in the range of, but not limited to, 0.1 to 5.0 microns and more preferably 0.3 to 3.0 microns. As the constraining tapes must undergo simultaneous densification and crystallization, their averaged glass particle size and particle size distribution are most critical for the attainment of desirable microstructure within the temperature range above the organic burnout (pyrolysis) and the softening point of the glass in the primary tape, The glasses described herein are produced by conventional glass making techniques. The glasses were prepared in 500–1000 gram quantities. Typically, the ingredients are weighed then mixed in the desired proportions and heated in a bottom-loading furnace to form a melt in platinum alloy crucibles. As well known in the art, heating is conducted to a peak temperature (1450–1600° C.) and for a time such that the melt becomes entirely liquid and homogeneous. The glass melts were quenched using a counter rotating stainless steel roller to form a 10–20 mil. thick platelet of glass. The resulting glass platelet was then milled to form a powder with its 50% volume distribution set between 1–5 microns. The glass powders were then formulated with filler and organic medium to cast tapes as detailed in the Examples section. The glass compositions shown in Table 1 represent a broad variety of glass chemistry (high amounts of glass former to low amounts of glass former). The glass former oxides are typically small size ions with high chemical coordination numbers such as $SiO_2$, $B_2O_3$, and $P_2O_5$. The remaining oxides represented in the table are considered glass modifiers and intermediates.

Ceramic filler such as $Al_2O_3$, $ZrO_2$, $TiO_2$, $ZrSiO_4$, $BaTiO_3$ or mixtures thereof may be added to the castable composition used to form the tapes in an amount of 0–50 wt. % based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts with the glass to form an Al-containing crystalline phase. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, α-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics. It is preferred that the filler has at least a bimodal particle size distribution with D50 of the larger size filler in the range of 1.5 and 3 microns and the D50 of the smaller size filler in the range of 0.3 and 0.8 microns.

In the formulation of constraining and primary tape compositions, the amount of glass relative to the amount of ceramic material is important. A filler range of 20–40% by weight is considered desirable in that the sufficient densification is achieved. If the filler concentration exceeds 50% by wt., the fired structure is not sufficiently densified and is too porous. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 µm and preferably not exceed 10 µm. Subject to these maximum size limitations, it is preferred that at least 50% of the particles, both glass and ceramic filler, be greater than 1 µm and less than 6 µm.

The organic medium in which the glass and ceramic inorganic solids are dispersed is comprised of a polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of polymer binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

Application

A green tape for use as a constraining tape or a primary tape is formed by casting a thin layer of a slurry dispersion of the glass, ceramic filler, polymeric binder and solvent(s) as described above onto a flexible substrate, heating the cast layer to remove the volatile solvent. It is preferred that the primary tape not exceed 20 mils in thickness and preferably 1 to 10 mils. It is preferred that the constraining tapes be 1 to 10 mils and preferably 1 to 3 mils in thickness. The tape is then blanked into sheets or collected in a roll form. The green tape is typically used as a dielectric or insulating material for multilayer electronic circuits. A sheet of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize and form via holes in the green tape. Typical via hole sizes range from 0.004" to 0.25". The interconnections between layers are formed by filling them via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. The laminates are trimmed with a hot stage cutter. Firing is carried out in a standard thick film conveyor belt furnace or in a box furnace with a programmed heating cycle. This method will, also, allow top and/or bottom conductors to be co-fired as part of the constrained sintered structure without the need for using a conventional release tape as the top and bottom layer, and the removal, and cleaning of the release tape after firing.

As used herein, the term "firing" means heating the assemblage in an oxidizing atmosphere such as air to a temperature, and for a time sufficient to volatilize (burn-out) all of the organic material in the layers of the assemblage to sinter any glass, metal or dielectric material in the layers and thus densify the entire laminate.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

According to the defined configuration of the various laminates (see FIGS. 1 to 5), green tape sheets of various thickness were blanked with corner registration holes into sheets with x- and y-dimensions ranging from 3"×3" to 8"×8". These were then punched to form via holes and then metallized with suitable surface and via fill conductors using standard processing techniques which are well known to those skilled in the art.

The parts were then fired by heating in an oxidizing atmosphere such as air to a temperature, and for a time sufficient to volatilize (burn-out) all of the organic material in the layers of the assemblage to sinter any glass, metal or dielectric material in the layers. In this way the entire laminate was densified.

The parts were then evaluated for any shrinkage and substrate camber.

EXAMPLES

Tape compositions used in the examples were prepared by ball milling the fine inorganic powders and binders in a volatile solvent or solvent blend. To optimize the lamination, the ability to pattern circuits, the tape burnout properties and the fired microstructure development, the following volume % formulation of slip was found to provide advantages. The formulation of typical slip compositions is also shown in weight percentage, as a practical reference. The inorganic phase is assumed to have a specific density of 4.5 g/cc for glass and 4.0 g/cc for alumina and the organic vehicle is assumed to have a specific density of 1.1 g/cc. The weight % composition changes accordingly when using glass and oxides other than alumina as the specific density maybe different than those assumed in this example.

Also please note in some of the entries in the tables that follow primary has been abbreviated as "Prim" and constraining has been abbreviate as "Constr".

|  | Volume % | Weight % |
| --- | --- | --- |
| Inorganic phase | 42% typical range | 74% typical range |
|  | 37–47% practical | 70–78% practical |
| Organic phase | 58% typical | 26% typical |
|  | 63–53% practical | 30–22% practical |

Since the tape is usually coated from slip, the composition for the slip must include sufficient solvent to lower the viscosity to less than 10,000 centipoise; typical viscosity ranges are 1,000 to 4,000 centipoise. An example of a slip composition is provided in Table 2. Depending on the chosen slip viscosity, higher viscosity slip prolongs the dispersion stability for a longer period of time (normally several weeks). A stable dispersion of tape constituents is usually preserved in the as-coated tape.

TABLE 2

SLIP COMPOSITION

| | Weight % | |
| --- | --- | --- |
| Component | Typical Range | Practical Range |
| Acrylate and methacrylate polymers | 4–6 | 4–6 |
| Phthalate type plasticizers | 1–2 | 1–2 |

TABLE 2-continued

SLIP COMPOSITION

| Component | Weight % Typical Range | Weight % Practical Range |
|---|---|---|
| Ethyl acetate/methyl ethyl ketone mixed solvent | 19.7 | 18–22 |
| Glass powder | 50.7 | 47–54 |
| Alumina powder | 23.2 | 20–27 |
| Inorganic pigment | 0.6 | 0–1 |

The glasses for the Examples found herein were all melted in Pt/Rh crucibles at 1450–1600° C. for about 1 hour in an electrically heated furnace. Glasses were quenched by metal roller as a preliminary step and then subjected to particle size reduction by milling. The powders prepared for these tests were adjusted to a 1–5 micron mean size by milling prior to formulation as a slip. Since additional milling is utilized in the fabrication of slip, the final mean size is normally in the range of 1–3 microns.

Example 1

Primary Tape Composition #1 (Glass #15, Table 1)
(4.5 mils tape thickness)

| Glass: | | Filler: $Al_2O_3$ (D50 = 2.8 micron) | | Filler content 33.9 vol % |
|---|---|---|---|---|
| | | | | Glass content 66.1 vol % |
| $B_2O_3$ | 8.50 wt. % | | | |
| $SiO_2$ | 53.50 | $Li_2O$ | 0.25 wt. % | |
| $Al_2O_3$ | 13.00 | SrO | 3.00 | |
| CaO | 17.00 | $K_2O$ | 1.50 | |
| MgO | 1.00 | | | |
| $Na_2O$ | 2.25 | | | |
| Glass Density 2.53 g/cc | | Alumina Density 4.02 g/cc | | |

Constraining Tape Composition #1 (Glass #2, Table 1)
(4.0 or 2.0 mils tape thickness)

| Glass: | | Filler: $Al_2O_3$ (D50 = 2.8 micron) | Filler content 33.9 vol % |
|---|---|---|---|
| $SiO_2$ | 13.77 wt. % | | |
| $ZrO_2$ | 4.70 | | |
| $B_2O_3$ | 26.10 | | |
| BaO | 14.05 | | |
| MgO | 35.09 | | |
| $Li_2O$ | 1.95 | | |
| $P_2O_5$ | 4.34 | | |
| Glass Density 3.06 g/cc | | Alumina Density 4.02 g/cc | |

Constraining Tape Composition #2 (Glass #6, Table 1)
(4.0 or 2.0 mils tape thickness)

| Glass: | | Filler: $Al_2O_3$ (D50 = 2.8 micron) | Filler content 33.9 vol % |
|---|---|---|---|
| $B_2O_3$ | 11.84 wt.% | | |
| BaO | 21.12 | | |
| $Li_2O$ | 1.31 | | |
| $P_2O_5$ | 4.14 | | |
| $TiO_2$ | 25.44 | | |
| $Cs_2O$ | 6.16 | | |
| $Nd_2O_3$ | 29.99 | | |
| Glass Density 4.45 g/cc | | Alumina Density 4.02 g/cc | |

The solids formulation of the primary and constraining tapes are shown as filler and glass content above. Three tape structures were made using these materials in construction as follows:

| Test #1 | Prim #1/Constr #1/Prim #1/Constr #2/Prim #1<br>Layer count ratio = 3/1/6/1/3<br>constraining thickness 4.0 mils,<br>primary thickness 4.5 mils<br>total/constraining thickness ratio = 7.8 |
|---|---|
| Test #2 | Prim #1/Constr #1/Prim #1/Constraining #2/Prim #1<br>Layer count ratio = 2/1/4/1/2<br>constraining thickness 4.0 mils,<br>primary thickness 4.5 mils<br>total/constraining thickness ratio = 5.5 |
| Test #3 | Prim #1/Constr #1/Prim #1/Constr #2/Prim #1<br>Layer count ratio = 3/1/4/1/3<br>constraining thickness 4.0 mils,<br>primary thickness 4.5 mils<br>total/constraining thickness ratio = 6.6 |
| Test #4 | Prim #1/Constr #1/Prim #1/Constraining#2/Prim #1<br>Layer count ratio = 2/1/3/1/2<br>constraining thickness 4.0 mils,<br>primary thickness 4.5 mils<br>total/constraining thickness ratio = 4.9 |

All samples were flat following belt furnace firing at 850° C., and they showed the following % x,y-shrinkage: Test #1 0.30%, Test #2 0.18%, Test #3 0.26% and Test #4 0.08%.

The onset of tape sintering between the respective primary and constraining tape in the above configurations is separated by about 75–85° C. The constraining tape developed rigid property near 700° C. and the primary tape at this temperature is just beginning to sinter.

The influence of the total/constraining tape thickness is seen to relate in general to the x,y-shrinkage values, and the smaller the ratio, the smaller the x,y-shrinkage.

Example 2

A Primary #2 Tape (4.5 mils thick) is paired with two different constraining tape compositions (Constraining #1 and Constraining #2) having identical total/constraining tape thickness ratio as those shown in the EXAMPLE 1.

Primary Tape Composition #2 (Glass #18, Table 1)
(4.5 mils tape thickness)

| Glass: | | Filler: $Al_2O_3$ (D50 = 2.8 micron) | | Filler content 33.9 vol % |
|---|---|---|---|---|
| $SiO_2$ | 54.50 wt % | $Na_2O$ | 2.20 | |
| $Al_2O_3$ | 12.72 | $Li_2O$ | 0.24 | |
| $B_2O_3$ | 8.32 | SrO | 2.94 | |
| CaO | 16.63 | $K_2O$ | 1.47 | |
| MgO | 0.98 | | | |
| Glass Density 2.55 g/cc | | Alumina Density 4.02 g/cc | | |

| | |
|---|---|
| Test #5 | Prim #2/Constr #1/Prim #2/Constr #2/Prim #2<br>Layer count ratio 3/1/6/1/3<br>constraining thickness 4.0 mils,<br>primary thickness 4.5 mils<br>total/constraining thickness ratio = 7.8 |
| Test #6 | Prim #2/Constr #1/Prim #2/Constr #2/Prim #2<br>Layer count ratio = 2/1/4/1/2<br>constraining thickness 4.0 mils,<br>primary thickness 4.5 mils<br>total/constraining thickness ratio = 5.5 |
| Test #7 | Prim #2/Constr #1/Prim #2/Constr #2/Prim #2<br>Layer count ratio = 3/1/4/1/3<br>constraining thickness 4.0 mils,<br>primary thickness 4.5 mils<br>total/constraining thickness ratio = 6.6 |
| Test #8 | Prim #2/Constr #1/Prim #2/Constr #2/Prim #2<br>Layer count ratio = 2/1/3/1/2<br>constraining thickness 4.0 mils,<br>primary thickness 4.5 mils<br>total/constraining thickness ratio = 4.9 |
| Test #9 | Prim #2/Constr #1/Prim #2/Const #2/Prim #2<br>Layer count ratio = 2/2/3/2/2<br>constraining thickness 2.0 mils,<br>primary thickness 4.5 mils<br>total/constraining thickness ratio = 4.9 |

All samples were flat following belt furnace firing at 850° C. and they showed the following % x,y-shrinkage: Test #5 0.20%, Test #6 0.11%, Test #7 0.17%, Test #8 0.05%, and Test #9 0.07%.

As one can see in the group Tests #5 to #8 (as compared to the group Tests #1 to #4), the role of the primary tape influences the degree of x,y-shrinkage control and the primary tape #2 is more effective to drive the x,y-shrinkage to zero. Furthermore, the configuration of Test #9 is similar to that of Test #8 except that both the Constraining tape constituents for Test #9 are consisted of two layers of tape at half of the thickness as those for Test #8. This adds another dimension of flexibility for circuit designer should more or less circuit layers are suitable to achieve desirable functional performances.

Example 3

This example uses the Constraining Tape #2 and 3 with the Primary Tape #2. Regarding the dielectric constant k values, the Constraining tape #2 is higher than that of Primary tape #2 which is similar to that of the Constraining tape #3.

| Constraining Tape #3 (Glass #21. Table 1) | | | |
|---|---|---|---|
| (4.0 or 2.0 mils tape thickness) | | | |
| Glass: | Filler: Al$_2$O$_3$ | Filler | |
| | (D50 = 2.5 micron) | content 33.9 vol % | |
| SiO$_2$ | 8.74 wt. % | Cs$_2$O | 6.10 |
| ZrO$_2$ | 2.44 | Nd$_2$O$_3$ | 28.45 |
| B$_2$O$_3$ | 11.77 | | |
| BaO | 7.30 | | |
| MgO | 2.48 | | |
| La$_2$O$_3$ | 27.55 | | |
| Li$_2$O | 1.15 | | |
| P$_2$O$_5$ | 4.00 | | |
| Glass Density 4.55 g/cc | | Alumina Density 4.02 g/cc | |

| | |
|---|---|
| Test #10 | Prim #2/Constr #2/Prim #2/Constr #3/Prim #2<br>Layer count ratio = 3/1/6/1/3<br>constraining thickness 4.0 mils,<br>primary thickness 4.5 mils<br>total/constraining thickness ratio = 7.8 |
| Test #11 | Prim #2/Constr #2/Prim #2/Constr #3/Prim #2<br>Layer count ratio = 2/1/4/1/2<br>constraining thickness 4.0 mils,<br>primary thickness 4.5 mils<br>total/constraining thickness ratio = 5.5 |
| Test #12 | Prim #2/Constr #2/Prim #2/Constr #3/Prim #2<br>Layer count ratio = 3/1/4/1/3<br>constraining thickness 4.0 mils,<br>primary thickness 4.5 mils<br>total/constraining thickness ratio = 6.6 |
| Test #13 | Prim #2/Constr #2/Prim #2/Constr #3/Prim #2<br>Layer count ratio = 2/1/3/1/2<br>constraining thickness 4.0 mils,<br>primary thickness 4.5 mils<br>total/constraining thickness ratio = 4.9 |

All samples were relatively flat following belt furnace firing at 850° C. and they showed the following % x,y shrinkage: Test #10 0.42%, Test #11 0.22%, Test #12 0.33% and Test #13 0.09%. Comparing the shrinkage values of the above 13 tests, it appears that the combination of the Primary tape #2 with the Constraining tape #1 and #2 provides the most effective x,y shrinkage control.

Example 4

In another experiment, Primary Tape #2 and Constraining Tape #1 and #2 were used. The differences between Test #7 of EXAMPLE 2 and Tests #14–#16 of EXAMPLE 4 are in the configuration of the multilayer laminates.

| | |
|---|---|
| Test #14 | Prim #2/Constr #1/Prim #2/Constr #2/Prim #2<br>Layer count ratio = 1/1/8/1/1<br>constraining thickness 4.0 mils,<br>primary thickness 4.5 mils<br>total/constraining thickness ratio = 6.6 |
| Test #15 | Prim #2/Constr #1/Prim #2/Constr #2/Prim #2<br>Layer count ratio 4/1/2/1/4<br>constraining thickness 4.0 mils,<br>primary thickness 4.5 mils<br>total/constraining thickness ratio = 6.6 |
| Test #16 | Prim #2/Constr #1/Constr #2/Prim #2<br>Layer count ratio = 5/1/1/5<br>constraining thickness 4.0 mils,<br>primary thickness 4.5 mils<br>total/constraining thickness ratio = 6.6 |
| Test #17 | Prim #2/Constr #1/Constr #2/Prim #2<br>Layer count ratio = 5/1/2/5<br>constraining thickness 4.0 mils,<br>primary thickness 4.5 mils<br>total/constraining thickness ratio = 4.8 |

Despite the layer order arrangement among the Primary tape and two Constraining tapes, the above 3 tests have identical total tape thickness/constraining tape thickness ratio. This is one of the critical factors controlling the x,y fired shrinkage. The x,y shrinkage values for test 14, 15, or 16 of, respectively, 0.19%, 0.15%, or 0.21% are close to one another mainly due to the same tape thickness ratio of 6.6. Test #16 is a special case where the two Constraining tapes were in direct contact. Since both of them formed rigid microstructure due to crystallization of the glass/filler in the tape, they served as the core to constrain the Primary tape at its peak firing temperature of 850° C. Test #17 resulted in a smaller x,y-shrinkage of 0.08%, which was contributed by a thicker core, consisted of one layer of Constraining tape #1 and two layers of Constraining tape #2. As disclosed in this invention, the first of the two Constraining tape #2 layers was located at the geometrical center of the laminate configuration and a pseudo-symmetry was attained.

The primary/constraining tape laminates disclosed in this invention can be fired in a typical LTCC belt furnace profile to achieve full densification and zero or nearly zero x,y-shrinkage. A typical LTCC belt furnace profile for 951 GREEN TAPE™ (a commercial product from E.I. DuPont) is a three and a half-hour burnout and sintering profile which includes: (1) 25° C. to 60° C. at 2.5° C./min, (2) 60° C. to 400° C. at 19.2° C./min, (3) 400° C. to 435° C. at 1.4° C./min, (4) 435° C. to 850° C. at 7.0° C./min, (5) dwell at 850° C. for 17 min, (6) 850° C. to 40° C. at 17.3° C./min, and (7) 40° C. to room temperature at 0.5° C./min. For anyone skilled in the art, the above profile can be modified according to one's belt furnace specifications so long as adequate organic burnout, ramp rate to peak temperature, peak temperature duration, and descending rate can be optimized to produce the desirable results.

What is claimed is:

1. A low-temperature co-fired ceramic structure consisting essentially of an upper portion and a lower portion,
wherein each portion comprises an assembly of one or more layers of glass-containing primary tape and one or more layers of low k or high k glass-containing internal self-constraining tape, and wherein the self-constraining tape and primary tape is arrayed in combinations to provide symmetric and/or asymmetric z-axis placement and layer thickness arrangements to form co-fired ceramic circuit structures when the tapes are metallized with planar interconnecting circuits
wherein the dielectric constant of the low k self contraining tape is less than 8, the dielectric constant of the high k tape is greater than 8,
wherein each portion has z-axis symmetry with respect to the tape layers of the portion, wherein the structure, consisting of the upper and lower portions, has z-axis asymmetry with respect to the dielectric constant of the self constraining tape layers,
and wherein each self-constraining tape can independently provide a self-constraining pressure-less assisted sintering LTCC assembly with the primary tape
and wherein, upon thermal processing, the glass of the self-constraining tapes initiates sintering to attain a rigid form before the onset of sintering of the primary tape,
and wherein the internal self-constraining tapes and the primary tape are laminated to form a compositionally asymmetrical laminate
and wherein the assembly is thermally processed producing a structure exhibiting an interactive suppression of x,y shrinkage.

2. The ceramic structure of claim 1 wherein the dielectric constant of the primary tape is in the range of 7 to 9.

3. The ceramic structure of claim 1, in which the internal self-constraining tape layers and primary tape layers are metallized in a planar and in an interconnection manner.

4. The ceramic structure of claim 1 wherein the structure is populated with surface mounted components.

5. The ceramic structure of claim 1 wherein the internal constraining tapes and the primary tape comprise filler particles having a bimodal particle size distribution with D50 of the larger size particles being in the range of 1.5 to 3 microns and D50 of the smaller size particles being in the range of 0.3 to 0.8 microns.

6. The ceramic structure of claim 1 wherein the glass of the primary tape comprises, based on total composition: $SiO_2$ 52–55, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %.

7. The ceramic structure of claim 1 wherein the glass of the high k self-constraining tape comprises, based on total composition: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %.

8. The ceramic structure of claim 1 wherein the glass of the low k self-constraining tape comprises, based on total composition: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight %.

9. A multilayer electronic circuit having as one of its layers a ceramic structure of claim 1.

10. A multilayer electronic circuit comprising a rigid structure of claim 1 having a capacitor function.

11. A method of making a low-temperature co-fired ceramic structure consisting essentially of an upper portion and a lower portion,
wherein each portion comprises an assembly of one or more layers of primary tape and one or more layers of low k or high k glass-containing internal self-constraining tape, and wherein the self-constraining tape and primary tape maybe arrayed in unique combinations to provide symmetric and/or asymmetric z-axis placement and layer thickness arrangements to form practical co-fired ceramic circuit structures when the tapes are metallized with planar and interconnecting circuits, wherein the dielectric constant of the low k self-constraining tape is less than 8, the dielectric constant of the high k self-constraining tape is greater than 8, wherein each portion has z-axis symmetry with respect to the tape layers of the portion, wherein the structure, consisting of the upper and lower portions, has z-axis asymmetry with respect to the dielectric constant of the self-constraining tape layers, and wherein each self-constraining tape can independently provide a constraining pressure-less assisted sintering LTCC assembly with the primary tape, comprising the following steps:

providing one or more layers of low k glass-containing internal self-constraining tape, providing one or more layers of high k glass-containing internal self-constraining tape, providing at least one layer of glass-containing primary tape, layering said internal self-constraining tapes and said primary tape(s) to form an upper portion and a lower portion, wherein each portion comprises one or more layers of low k self-constraining tape or high k glass-containing internal self-constraining tape, and wherein each portion does not contain both low k tape and high k tape, wherein each portion comprises at least one layer of glass-containing primary tape, wherein the dielectric constant of the low k self-constraining tape is less than 8, the dielectric constant of the high k self-constraining tape is greater than 8, wherein each portion has z-axis symmetry with respect to the tare layers of the portion, wherein the structure, consisting of the upper and lower portions, has z-axis asymmetry with respect to the dielectric constant of the self-constraining tape layers, and wherein each self-constraining tape can independently provide a self-constraining pressure-less assisted sintering LTCC assembly with the primary tape, and wherein, upon thermal processing, the glass of the self-constraining tapes initiates sintering to attain a rigid form before the onset of sintering of the primary tape, and wherein the internal self-constraining tapes and the primary tape are laminated to form a compositionally asymmetrical laminate
and wherein the assembly is thermally processed producing a structure exhibiting an interactive suppression of x,y shrinkage.

12. The method of claim 11 wherein the glass of the primary tape comprises, based on total composition: $SiO_2$ 52–55, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %.

13. The method of claim 11 wherein the glass of the high k self-constraining tape comprises, based on total composition: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_7O_3$ 29–32 in weight %.

14. The method of claim 11 wherein the glass of the low k self-constraining tape comprises, based on total composition: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight %.

15. The method of claim 11 wherein the internal self-constraining tape layers and primary tape layers are metallized in a planar and in an interconnection manner.

* * * * *

UNITED STATES PATENT AND TRADEMARK OFFICE
CERTIFICATE OF CORRECTION

| | | |
|---|---|---|
| PATENT NO. | : 7,067,026 B2 | Page 1 of 1 |
| APPLICATION NO. | : 10/994594 | |
| DATED | : June 27, 2006 | |
| INVENTOR(S) | : Carl B. Wang, Kenneth Warren Hang and Christopher R. Needes | |

It is certified that error appears in the above-identified patent and that said Letters Patent is hereby corrected as shown below:

At Column 8, line 31, "crystallization, and revivification" should read -- crystallization, and devitrification --.

Signed and Sealed this

Twenty-seventh Day of February, 2007

JON W. DUDAS
*Director of the United States Patent and Trademark Office*